US009599884B2

United States Patent
Fukami et al.

(10) Patent No.: US 9,599,884 B2
(45) Date of Patent: Mar. 21, 2017

(54) LIGHT SOURCE APPARATUS AND IMAGE DISPLAY APPARATUS

(71) Applicant: Sony Corporation, Tokyo (JP)

(72) Inventors: Tadashi Fukami, Kanagawa (JP); Atsuhiro Chiba, Tokyo (JP); Masahiro Takada, Tokyo (JP); Norihiro Ohse, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/595,960

(22) Filed: Jan. 13, 2015

(65) Prior Publication Data

US 2015/0205190 A1 Jul. 23, 2015

(30) Foreign Application Priority Data

Jan. 20, 2014 (JP) .................... 2014-007839

(51) Int. Cl.
*G03B 21/20* (2006.01)
*H04N 9/31* (2006.01)
*H01S 5/0683* (2006.01)

(52) U.S. Cl.
CPC ....... *G03B 21/2053* (2013.01); *G03B 21/206* (2013.01); *H04N 9/3111* (2013.01); *H04N 9/3194* (2013.01); *G03B 21/204* (2013.01); *H01S 5/0683* (2013.01)

(58) Field of Classification Search
CPC  G03B 21/204; G03B 21/206; G03B 21/2013; G03B 21/2053; G03B 33/08; G03B 33/12; H04N 9/3114; H04N 9/3155; H04N 9/3105; H04N 9/3117
See application file for complete search history.

(56) References Cited

U.S. PATENT DOCUMENTS

| | | | | |
|---|---|---|---|---|
| 6,050,690 A * | 4/2000 | Shaffer | ................. | G03B 21/53 353/121 |
| 2009/0244499 A1* | 10/2009 | Bartlett | .................... | G02B 6/00 353/99 |
| 2010/0244731 A1* | 9/2010 | Kaihotsu | ............. | H01L 25/0753 315/294 |
| 2011/0043764 A1* | 2/2011 | Narikawa | ............ | G03B 21/204 353/31 |
| 2011/0075055 A1* | 3/2011 | Bilbrey | ..................... | H04N 5/74 348/744 |
| 2011/0310349 A1* | 12/2011 | Yanai | .................... | G02B 27/285 353/20 |
| 2012/0188516 A1* | 7/2012 | Kashiwagi | ............. | G02B 7/006 353/31 |
| 2013/0242266 A1* | 9/2013 | Hara | .................... | G03B 21/206 353/31 |

FOREIGN PATENT DOCUMENTS

JP   2012-104489 A   5/2012

* cited by examiner

*Primary Examiner* — Sultan Chowdhury
(74) *Attorney, Agent, or Firm* — Wolf, Greenfield & Sacks, P.C.

(57) ABSTRACT

A light source apparatus includes a plurality of light source units, a sensor unit, and an interval control unit. The sensor unit is capable of receiving a plurality of emitted light beams from the plurality of light source units and sampling intensities of the emitted light beams at a predetermined sampling interval. The interval control unit is capable of controlling the predetermined sampling interval on the basis of an output characteristic relating to each of the emitted light beams from the plurality of light source units.

17 Claims, 14 Drawing Sheets

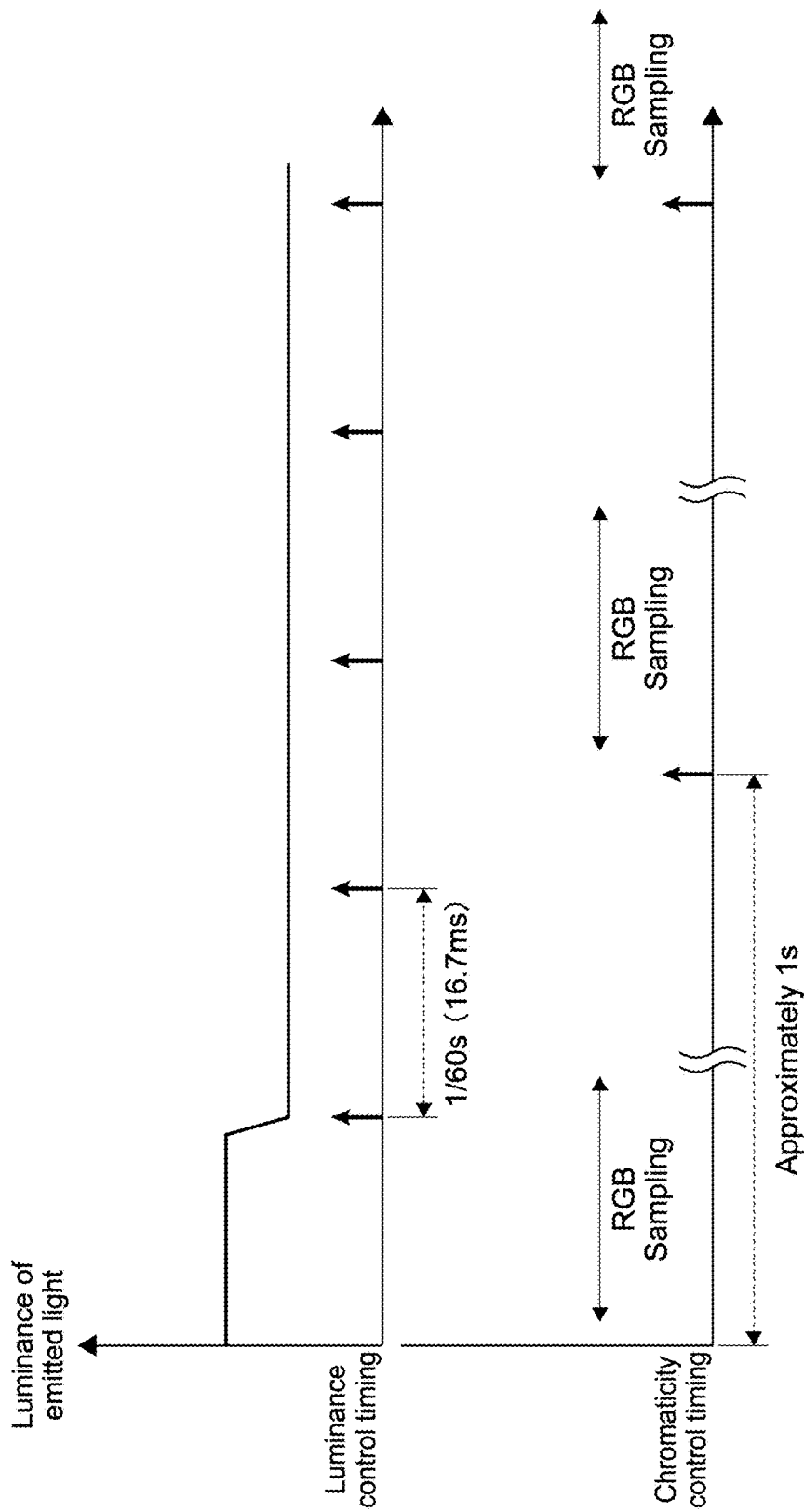

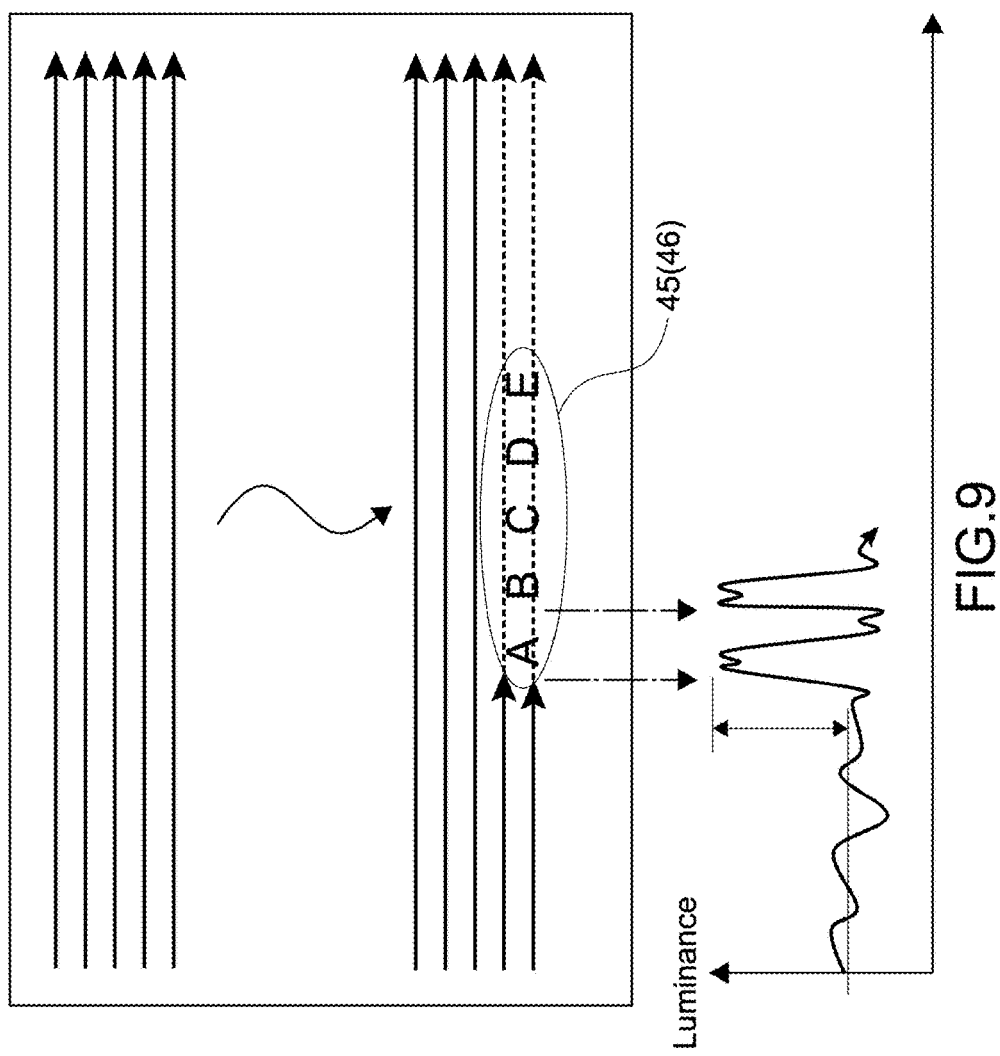

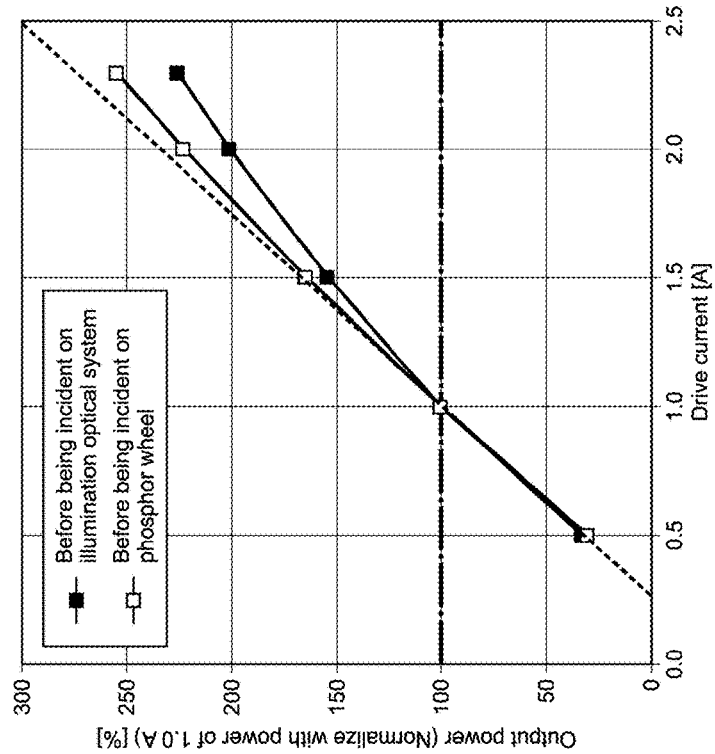
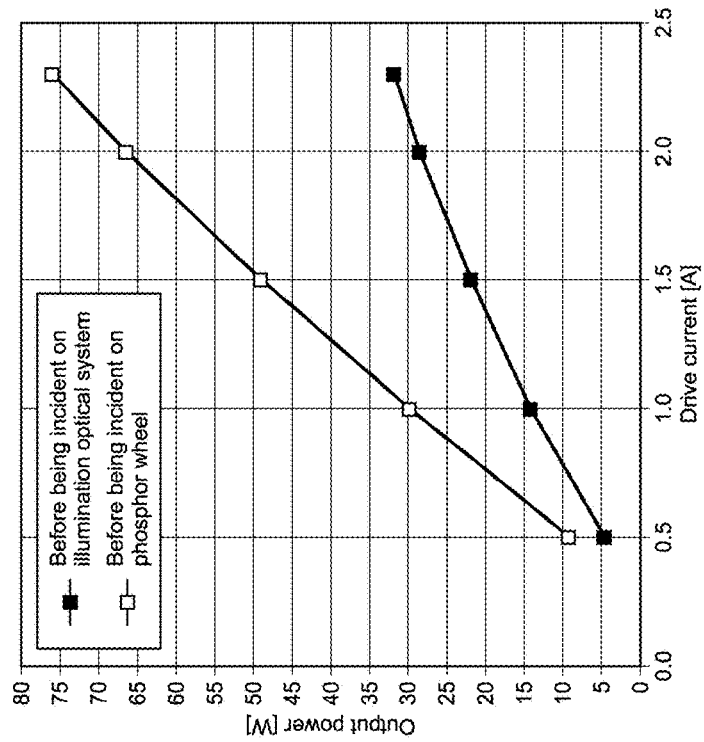

LIGHT SOURCE APPARATUS AND IMAGE DISPLAY APPARATUS

CROSS REFERENCE TO RELATED APPLICATIONS

This application claims the benefit of Japanese Priority Patent Application JP 2014-007839 filed Jan. 20, 2014, the entire contents of which are incorporated herein by reference.

BACKGROUND

The present technology relates to a light source apparatus and an image display apparatus.

From the past, an image display apparatus such as a projector is widely used. For example, light from a light source is modulated by a light modulation element such as a liquid crystal element, and modulated light is projected on a screen or the like, thereby displaying an image. In recent years, products that use not a mercury lamp or a xenon lamp but a solid light source such as an LED (Light Emitting Diode) or an LD (Laser Diode) for a light source used for a projector have been more common. The solid light source such as the LED has a long life. Therefore, a lamp exchange performed in the past is unnecessary, and such an advantage that the lamp is immediately turned on when turning on the power is obtained.

Japanese Patent Application Laid-open No. 2012-104489 discloses a projector that adopts an illuminating apparatus that uses a semiconductor light emitting element such as an LED as a light source. In the illuminating apparatus of the projector, light intensities of illumination light of colors from the LEDs are sequentially detected by a common photoelectric conversion element. The detected light intensities of the illumination light of the colors are sampled in a common sample hold circuit and fed back to drive circuits for the colors. In this way, the common sampling system is provided with respect to the illumination light of the colors, with the result that it is possible to eliminate individual differences of the sampling system and display an image having color uniformity, even if a variation in temperature coefficient of the LEDs is caused.

SUMMARY

As described above, as a light source apparatus used for an image display apparatus or the like, a light source apparatus capable of emitting light having a desired chromaticity and a desired luminance is being demanded.

In view of the circumstances as described above, it is desirable to provide a light source apparatus capable of emitting light having a desired chromaticity and a desired luminance and an image display apparatus using the same.

According to an embodiment of the present technology, there is provided a light source apparatus including a plurality of light source units, a sensor unit, and an interval control unit.

The sensor unit is capable of receiving a plurality of emitted light beams from the plurality of light source units and sampling intensities of the emitted light beams at a predetermined sampling interval.

The interval control unit is capable of controlling the predetermined sampling interval on the basis of an output characteristic relating to each of the emitted light beams from the plurality of light source units.

In the light source apparatus, the intensities of the plurality of emitted light beams from the plurality of light source units are sampled at the predetermined sampling interval. At this time, on the basis of the output characteristics of the light source units, the predetermined sampling interval is controlled. As a result, it is possible to emit light having desired luminance and chromaticity.

The light source apparatus may further include a drive unit capable of applying a drive current to each of the plurality of light source units. In this case, the interval control unit may control the predetermined sampling interval on the basis of the output characteristic for the drive current from the drive unit.

As a result, it is possible to control the luminance and the chromaticity of the emitted light with high accuracy.

The interval control unit may control the predetermined sampling interval with a value of the drive current applied to each of the plurality of light source units as a reference.

As a result, it is possible to control the luminance and the chromaticity of the emitted light with high accuracy in accordance with the drive of the light source units.

On the basis of a result of the sampling, the drive unit may apply the drive current to each of the plurality of light source units in such a manner that a ratio of the intensities of the emitted light beams falls within a predetermined range.

As a result, it is possible to control the luminance and the chromaticity of the emitted light with high accuracy.

The drive unit may be capable of adjusting the value of the drive current applied to each of the plurality of light source units on the basis of information from outside.

As a result, it is possible to emit light having desired luminance and chromaticity.

The sensor unit may receive synthesis light obtained by synthesizing the plurality of emitted light beams and sample intensities of the emitted light beams at a common sampling interval. In this case, the interval control unit may control the common sampling interval.

As a result, it is possible to sample the intensities of the plurality of emitted light beams with a simple structure and to downsize the light source apparatus, for example.

The plurality of light source units may include a first light source unit having a first solid light source group including one or more solid light sources that emit a first visible light with a predetermined wavelength range, and a second light source unit having a second solid light source group including one or more solid light sources that emit excitation light with a predetermined wavelength range and a light emitting body that emits a second visible light with a wavelength range different from the excitation light with the predetermined wavelength range by being excited by the excitation light. In this case, the light source apparatus may further include a synthesis unit configured to generate white light obtained by synthesizing the first visible light that is the emitted light from the first light source unit and the second visible light that is the emitted light from the second light source unit.

In the light source apparatus, it is possible to control luminance and chromaticity of white light emitted as synthesis light with high accuracy.

The first and second solid light source groups each may be capable of emitting light with a blue wavelength range. In this case, the light emitting body may emit light including light with a red wavelength range and light with a green wavelength range.

By appropriately controlling the intensities of light with the blue wavelength range emitted from the first and second solid light source groups, it is possible to control the luminance and the chromaticity of the white light emitted as the synthesis light with high accuracy.

In the case where a value of an excitation drive current applied to the second solid light source group is smaller than a predetermined threshold value, the interval control unit may set a first common sampling interval, and in the case where the value of the excitation drive current is larger than the predetermined threshold value, the interval control unit may set a second common sampling interval smaller than the first common sampling interval.

By controlling the common sampling intervals in accordance with the light emission characteristics of the second light source units having the light emitting body, it is possible to control the luminance and the chromaticity of the white light with high accuracy.

The sensor unit may include a single sensor capable of measuring intensities of light with the blue wavelength range, light with the red wavelength range, and light with the green wavelength range.

By using the single sensor, it is possible to downsize the light source apparatus, for example.

The light source apparatus may further include a monitoring unit configured to monitor whether the ratio of the intensities of the emitted light beams is capable of being maintained within the predetermined range by applying the drive current based on the result of the sampling.

As a result, it is possible to keep the quality of the light source apparatus high.

According to another embodiment of the present technology, there is provided an image display apparatus including a light source apparatus, an image generation system, and a projection system.

The light source apparatus includes a plurality of light source units, the sensor unit, the interval control unit, and a synthesis unit configured to generate synthesis light by synthesizing the emitted light beams from the plurality of light source units.

The image generation system includes an image generation element that generates an image on the basis of irradiation light, and an illumination optical system that irradiates the image generation element with the synthesis light emitted from the light source apparatus.

The projection system is configured to project the image generated by the image generation element.

In the image display apparatus, because the synthesis light having the desired luminance and chromaticity is emitted by the light source apparatus, it is possible to attain high-quality image displaying.

The light source apparatus may include a drive unit capable of applying a drive current to each of the plurality of light source units. In this case, the interval control unit may control the predetermined sampling interval on the basis of the output characteristic for the drive current from the drive unit.

As a result, it is possible to control the luminance and the chromaticity of the synthesis light with high accuracy and attain high-quality image displaying.

The interval control unit may set a threshold value to a value of the drive current from the drive unit, set a first sampling interval in the case where the value of the drive current is smaller than the threshold value, and set a second sampling interval smaller than the first sampling interval in the case where the value of the drive current is larger than the threshold value.

By controlling the sampling intervals as described above, it is possible to emit the synthesis light having the desired luminance and chromaticity.

The first sampling interval may be larger than a frame rate of the image generated by the image generation system, and the second sampling interval may be smaller than the frame rate of the image generated.

In this way, the sampling intervals may be controlled with the frame rate as a reference.

On the basis of information relating to the image generated by the image generation system, the drive unit may adjust the value of the drive current applied to each of the plurality of light source units.

As a result, it is possible to attain the high-quality image displaying.

The projection system may project the image by an eccentric optical system.

By using the present technology, for example, even in the case where the eccentric optical system is used, it is possible to easily attain auto iris.

As described above, according to the embodiments of the present technology, it is possible to emit the light having the desired chromaticity and luminance. It should be noted that the effects described herein are not limited, and any effect described in the present disclosure may be provided.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 8 is a diagram showing an example of timings when luminance control and chromaticity control are performed;

FIG. 9 is a diagram for explaining an example of histogram detection;

FIGS. 10A and 10B are graphs showing a relationship between output powers of excitation light and drive current values and a relationship between output powers of yellow light and drive current values, respectively;

DETAILED DESCRIPTION OF EMBODIMENTS

Hereinafter, an embodiment of the present disclosure will be described with reference to the drawings.

(Image Display Apparatus)

Figure 1:
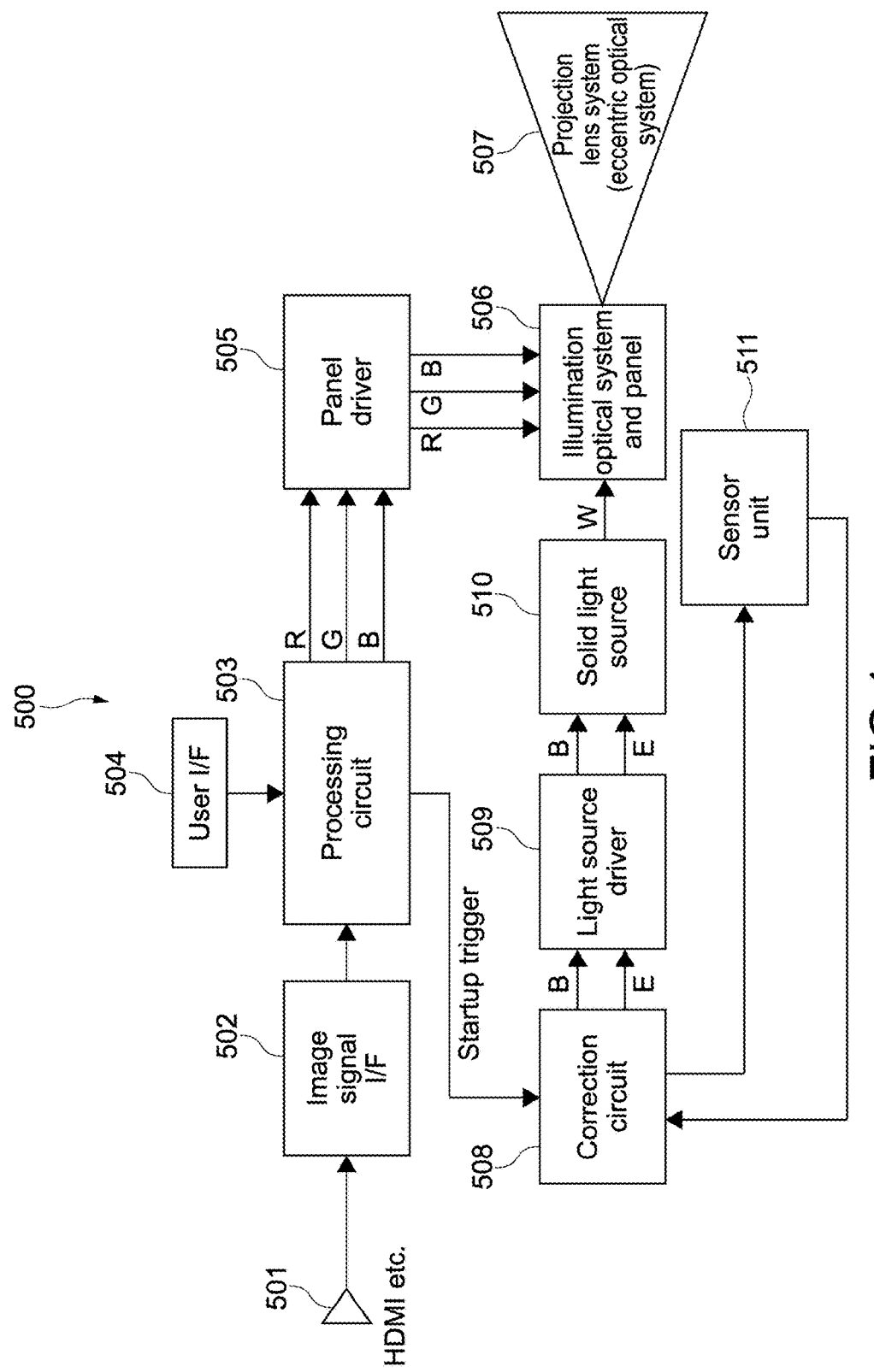
FIG. 1 is a schematic diagram showing an example of a basic structure of an image display apparatus according to an embodiment of the present technology.

FIG. 1 is a schematic diagram showing an example of a basic structure of an image display apparatus according to an embodiment of the present technology. An image display apparatus 500 is used as a projector for presentation or a digital cinema, for example. The present technology to be described below can be applied to image display apparatuses such as a television apparatus and a monitor apparatus used for other purposes.

The image display apparatus 500 includes an input terminal unit 501, an image signal interface (I/F) 502, a processing circuit 503, a user interface 504, a panel driver 505, an illumination optical system and panel 506, and a projection lens system 507. Further, the image display apparatus 500 includes a correction circuit 508, light source driver 509, a solid light source 510, and a sensor unit 511.

The input terminal unit 501 is a terminal for inputting an image signal. As the input terminal unit 501, for example, an HDMI (registered trademark) (High Definition Multimedia Interface) terminal, a composite terminal, a D video terminal, or the like is used. The image signal interface 502 receives an image signal input through the input terminal unit 501 and outputs the signal to the processing circuit 503. The specific structure of the image signal interface 502 is not limited.

The processing circuit 503 processes the image signal output from the image signal interface 502. For example, the processing circuit 503 converts a YCrCb signal included in the image signal into an RGB signal. In addition, various processes are performed for displaying images, including improvement of a resolution, image improvement, timing control, and the like. Further, the processing circuit 503 can perform the processes on the basis of an instruction from a user which is input through the user interface 504.

The user interface 504 outputs an instruction signal from an operation unit such as an operation button and a touch panel provided on the image display apparatus 500 to the processing circuit 503. The specific structures of the operation unit and the user interface 504 are not limited.

The panel driver 505 receives an image signal including color information relating to RGB output from the processing circuit 503. Then, the panel driver 505 outputs a drive signal for driving each of three panels provided for the respective colors of the RGB to the illumination optical system and panel 506. The panels in the illumination optical system and panel 506 generates an image by modulating each color light on the basis of the drive signal from the panel driver 505. The image generated by the panels for RGB is synthesized, and the projection lens system 507 is irradiated therewith.

In this embodiment, the panel corresponds to an image generation element that generates an image on the basis of irradiation light. As the image generation element, any element such as a liquid crystal panel and a digital micromirror device (DMD) may be used. Further, not by the three panels for the RGB colors but by a single panel, a color image may be generated.

The projection lens system 507 projects a color image illuminated by the illumination optical system and panel 506 on a screen (not shown) or the like. The structure of the projection lens system 507 is not limited. In this embodiment, an eccentric optical system is used. That is, an optical axis of the illumination optical system and panel 506 that outputs the image is designed not to coincide with an optical axis of the projection lens system 507. As the image display apparatus 500, for example, a short focus projector is provided. The projection lens system 507 corresponds to a projection system that projects an image generated by an image generation element in this embodiment.

The correction circuit 508 is a circuit for correcting the chromaticity and luminance of an image generated by the panels. In this embodiment, on the basis of a sampling result or the like from the sensor unit 511, a correction signal is output. Specifically, the correction circuit appropriately sets a value of a drive current applied to the solid light source 510. The setting of the drive current value will be described later.

The light source driver 509 receives, from the correction circuit 508, a correction signal (setting signal of the drive current). Then, on the basis of the signal, the light source driver 509 outputs a drive signal for driving the solid light source 510. Further, by the light source driver 509, a predetermined drive current is applied from a power supply to the solid light source 510. The specific structure of the light source driver 509 is not limited.

The solid light source 510 irradiates the illumination optical system and panel 506 with white light obtained by synthesizing emitted light of the RGB colors. The illumination optical system in the illumination optical system and panel 506 divides the white light emitted from the solid light source 510 into the colors of the RGB and irradiates the three panels with the light of the colors. The specific structure of the illumination optical system is not limited. The illumination optical system and panel 506 having the three panels and illumination optical system corresponds to an image generation system in this embodiment.

The sensor unit 511 can receive the white light emitted from the solid light source 510 and can sample the intensities of the light of the RGB at predetermined sampling intervals. The sampling results are output to the correction circuit 508.

In the image display apparatus 500, the correction circuit 508, the light source driver 509, the solid light source 510, and the sensor unit 511 are blocks that operate as the light source apparatus according to the present technology. The detailed structure and operation of the light source apparatus will be described later.

As a basic operation of an image display by the image display apparatus 500, on the basis of the input image signal, from the processing circuit 503 to the panel driver 505, an image signal including color information relating to the RGB is output. At a predetermined timing corresponding to the timing of the output, from the processing circuit 503 to the correction circuit 508, a startup trigger signal is output.

From the panel driver 505 to the three panels for the RGB, the drive signals for each RGB are output. On the other hand, the correction circuit 508 that has received the startup trigger signal outputs the setting signal of the drive current to the light source driver 509. In this embodiment, the setting signal for a blue light source unit that emits blue light (B) and the setting signal for an excitation light source unit that emits excitation light (E) are output. Those light source units will be described in detail later.

From the light source driver 509 to the solid light sources (blue light source unit and excitation light source unit), the set drive signals are applied, and the white light is applied to the panels of the RGB through the illumination optical system. Images generated on the panels are synthesized and projected through the projection lens system 507.

(Light Source Apparatus)

Figure 2:
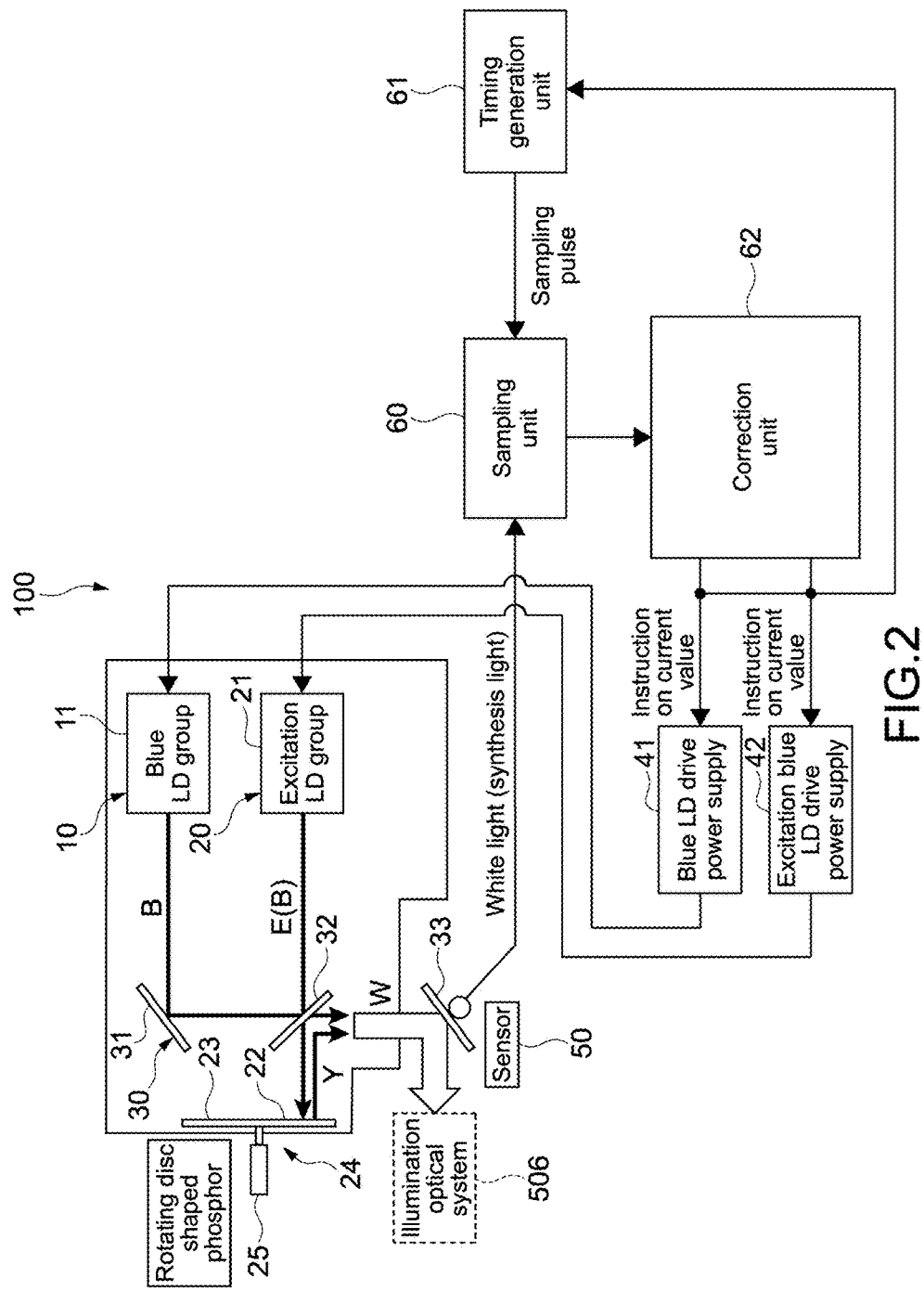
FIG. 2 is a schematic diagram showing an example of the structure of a light source apparatus.

FIG. 2 is a schematic diagram showing an example of the structure of a light source apparatus according to this embodiment. A light source apparatus 100 includes a blue light source unit 10, an excitation light source unit 20, a synthesis optical system 30, a first drive power supply 41, a second drive power supply 42, and a sensor 50. Further, the light source apparatus 100 includes, as functional blocks, a sampling unit 60, a timing generation unit 61, and a correction unit 62.

The blue light source unit 10 includes a first blue LD group (solid light source group) 11 including at least one blue LD (solid light source) that emits blue laser light B with a blue wavelength range, as a first visible light with a predetermined wavelength range. In this embodiment, the blue LD group constituted of the plurality of blue LDs that are two dimensionally arranged is used. The blue laser light B emitted from the first blue LD group 11 is emitted light from the blue light source unit 10. The blue light source unit 10 corresponds to a first light source unit in this embodiment.

The excitation light source unit 20 includes a second blue LD group (solid light source group) 21 including at least one blue LD (solid light source) that emits excitation light E with a blue wavelength range, as excitation light with a predetermined wavelength range. Further, the excitation light source unit 20 includes a phosphor (light emitting body) 22 that emits a second visible light with a wavelength range different from the excitation light E by being excited by the excitation light E.

As shown in FIG. 2, the phosphor 22 has a rotating disc shape. Specifically, on a surface of a base portion 23 having a disc shape, a phosphor wheel 24 on which the phosphor 22 is formed is used. To a rotary shaft of the phosphor wheel 24, a motor 25 is attached. By a rotating drive of the motor 25, the phosphor wheel 24 is rotated. The phosphor 22 includes a fluorescent substance that emits fluorescence by being excited by the excitation light E. The phosphor 22 emits light (yellow light Y) with a wavelength range from a red wavelength range to a green wavelength range, as a second visible light.

As the fluorescent substance included in the phosphor 22, for example, a YAG (yttrium aluminum garnet) based phosphor is used. It should be noted that the kind of the fluorescent substance, the wavelength range of light excited, and the wavelength range of visible light generated by the excitation are not limited.

In this embodiment, the excitation light source unit 20 corresponds to a second light source unit. The yellow light Y as the second visible light is emitted light from the excitation light source unit 20.

The wavelength ranges of the blue laser light emitted from the first and second blue LD groups 11 and 21 may be the same or may be different within the blue wavelength range. Further, the numbers of blue LDs in the respective groups are not limited.

The synthesis optical system (synthesis unit) 30 generates white light W obtained by synthesizing the blue laser light B emitted from the blue light source unit 10 and the yellow light Y emitted from the excitation light source unit 20 and emits the white light W. The synthesis optical system 30 includes mirrors 31 and 33 and a dichroic mirror 32. The mirror 31 reflects the blue laser light B emitted from the blue light source unit 10 to the dichroic mirror 32.

The dichroic mirror 32 selectively reflects light with a predetermined wavelength range and causes light with a wavelength range excluding the predetermined wavelength range to pass therethrough. In the example shown in FIG. 2, the blue laser light B and the excitation light E as the laser light with the blue wavelength range are transmitted through the dichroic mirror 32. On the other hand, the yellow light Y emitted from the phosphor 22 is reflected by the dichroic mirror 32. As a result, the blue laser light B and the yellow light Y are synthesized on the same optical axis, thereby generating the white light W. The generated white light W is reflected on the mirror 33 and reflected on the illumination optical system 506. It should be noted that the structure of the synthesis optical system 30 is not limited.

The first drive power supply 41 is a power supply for applying a drive current to the first blue LD group 11 of the blue light source unit 10. The second drive power supply 42 is a power supply for applying a drive current to the second blue LD group 21 of the excitation light source unit 20. The specific structures of the first drive power supply 41 and the second drive power supply 42 are not limited. It should be noted that in the following, the drive current applied to the first blue LD group 11 is referred to as a first drive current. Further, the drive current applied to the second blue LD group 21 is referred to as a second drive current.

The sensor 50 can receive the white light W and can measure intensities of light with a blue wavelength range, light with a red wavelength range, and light with a green wavelength range. On a light reception surface of the sensor 50, a blue filter, a red filter, and a green filter for causing light with the wavelength ranges of the RGB to transmit therethrough, respectively, are provided. The plurality of color filters disperses light with the wavelength ranges, thereby making it possible to measure the intensities thereof. The specific structure of the sensor 50 is not limited and a known photo sensor or the like may be used as appropriate, for example.

The intensity of light with the blue wavelength range measured by the sensor 50 corresponds to the intensity of the blue laser light B as the emitted light from the blue light source unit 10. The intensities of light with the red wavelength range and light with the green wavelength range correspond to the intensity of the yellow light Y as the emitted light from the excitation light source unit 20.

Figure 3:
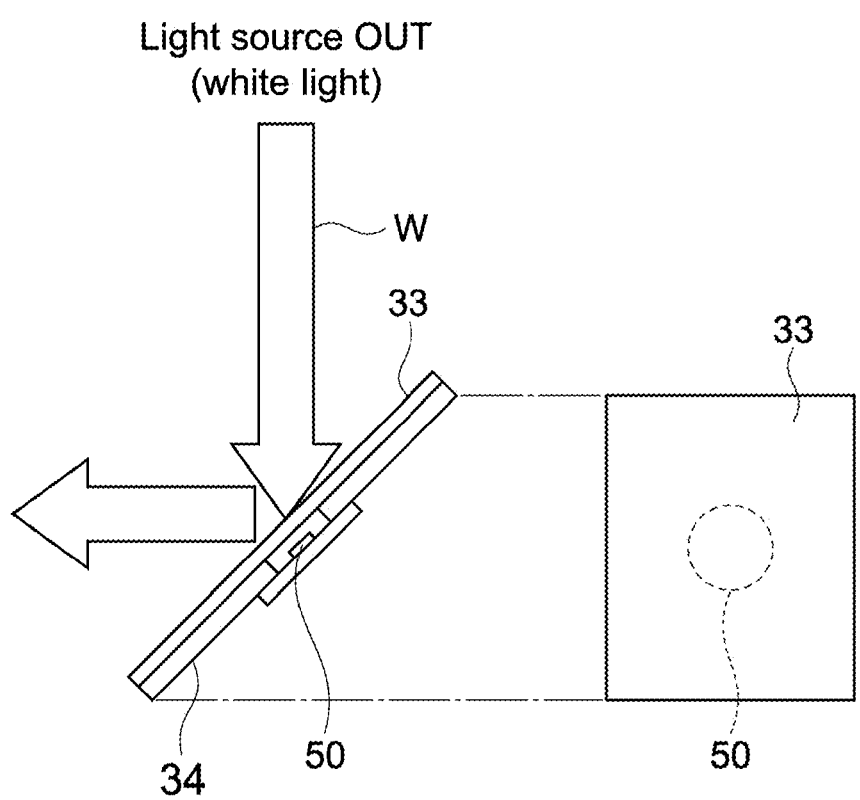
FIG. 3 is a schematic diagram showing an example of an attachment position of a sensor.

FIG. 3 is a schematic diagram showing an example of an attachment position of the sensor 50. As shown in the left part of FIG. 3, in this embodiment, on a back surface 34 of the mirror 33 that reflects the white light W to the illumination optical system 506, the sensor 50 is attached. Light of approximately 1% of the white light that enters the mirror 33 is transmitted through the mirror 33. The sensor 50 receives the transmitted light and measures the intensities of light with the wavelength ranges of the RGB.

As shown in the right part of FIG. 3, the sensor 50 is attached to an approximately center portion on the back surface 34 side when viewed from the front side of the mirror 33. However, the position to which the sensor 50 is attached is not limited, as long as the attachment position is on the optical axis of the white light W emitted.

The sampling unit 60 can sample the intensities of light with the wavelength ranges of the RGB, which are measured by the sensor 50, at predetermined sampling intervals. In this embodiment, for the light of the RGB, the sampling is performed at common sampling intervals. The sensor 50 and the sampling unit 60 shown in FIG. 2 are included in the sensor unit 511 shown in FIG. 1.

The correction unit 62 is a functional block implemented by, for example, the correction circuit 508 shown in FIG. 1. The correction unit 62 outputs correction information for correcting the chromaticity and luminance of an image on the basis of the sampling result from the sampling unit 60. The correction unit 62 outputs, to the first drive power supply 41, an instruction on the first drive current value applied to the first blue LD group 11. Further, the correction unit 62 outputs, to the second drive power supply 42, an instruction on the second drive current value applied to second blue LD group 21.

The correction unit 62, the first and second drive power supplies 41 and 42, and the light source driver 509 shown in FIG. 1 function as drive units in this embodiment.

The timing generation unit 61 sets a timing of the sampling performed by the sampling unit 60. The timing generation unit 61 generates a sampling pulse corresponding to the timing of the sampling and outputs the pulse to the sampling unit 60. That is, the timing generation unit 61 sets the sampling interval as appropriately. In this embodiment, the timing generation unit 61 functions as an interval control unit capable of controlling a predetermined sampling interval on the basis of output characteristics relating to emitted light from a plurality of light source units.

In this embodiment, in accordance with output characteristics of the blue light source unit 10, the timing generation unit 61 controls the sampling interval for sampling the intensity of the blue laser light B. In addition, in accordance with output characteristics of the excitation light source unit 20, the sampling interval for sampling the intensity of the yellow light Y (red wavelength range light and green wavelength range light) is controlled. As described above, in this embodiment, the white light W is received, and at the common sampling interval, the intensities of light with the wavelength ranges are sampled. Thus, the timing generation unit 61 controls the common sampling interval.

As will be described in detail later, in this embodiment, the output characteristics of the light source units refer to output characteristics with respect to drive currents applied to the light source units. That is, to what extent and how the light source units emit the light with respect to the applied drive current corresponds to the output characteristics. As shown in FIG. 2, the timing generation unit 61 can appropriately control the common sampling interval on the basis of the drive current value output from the correction unit 62.

The structures for attaining the sampling unit 60, the correction unit 62, and the timing generation unit 61 are not limited. For example, hardware resources such as a circuit may attain functional blocks, or software such as a program may attain the blocks. Of course, the functional blocks may be attained by the hardware resources and software in cooperation with each other.

For example, as the circuit, a sample hold circuit, a matrix circuit that converts from the RGB to the XY chromaticity, various determination circuits, a setting circuit for the drive current, an interface circuit, an on and off timing generation circuit for the blue LD group, a command issue and analysis circuit, or the like is used.

The program is executed by a control unit that controls the mechanisms in the image display apparatus 500, for example. The control unit includes, for example, a CPU, a RAM, a ROM, and the like, and the CPU loads the program recorded in the ROM in advance to the RAM and executes the program, thereby controlling the mechanisms. Further, the CPU executes the predetermined program, thereby attaining a predetermined functional block. The structure of the control unit is not limited, and any hardware and software may be used.

Figure 4:
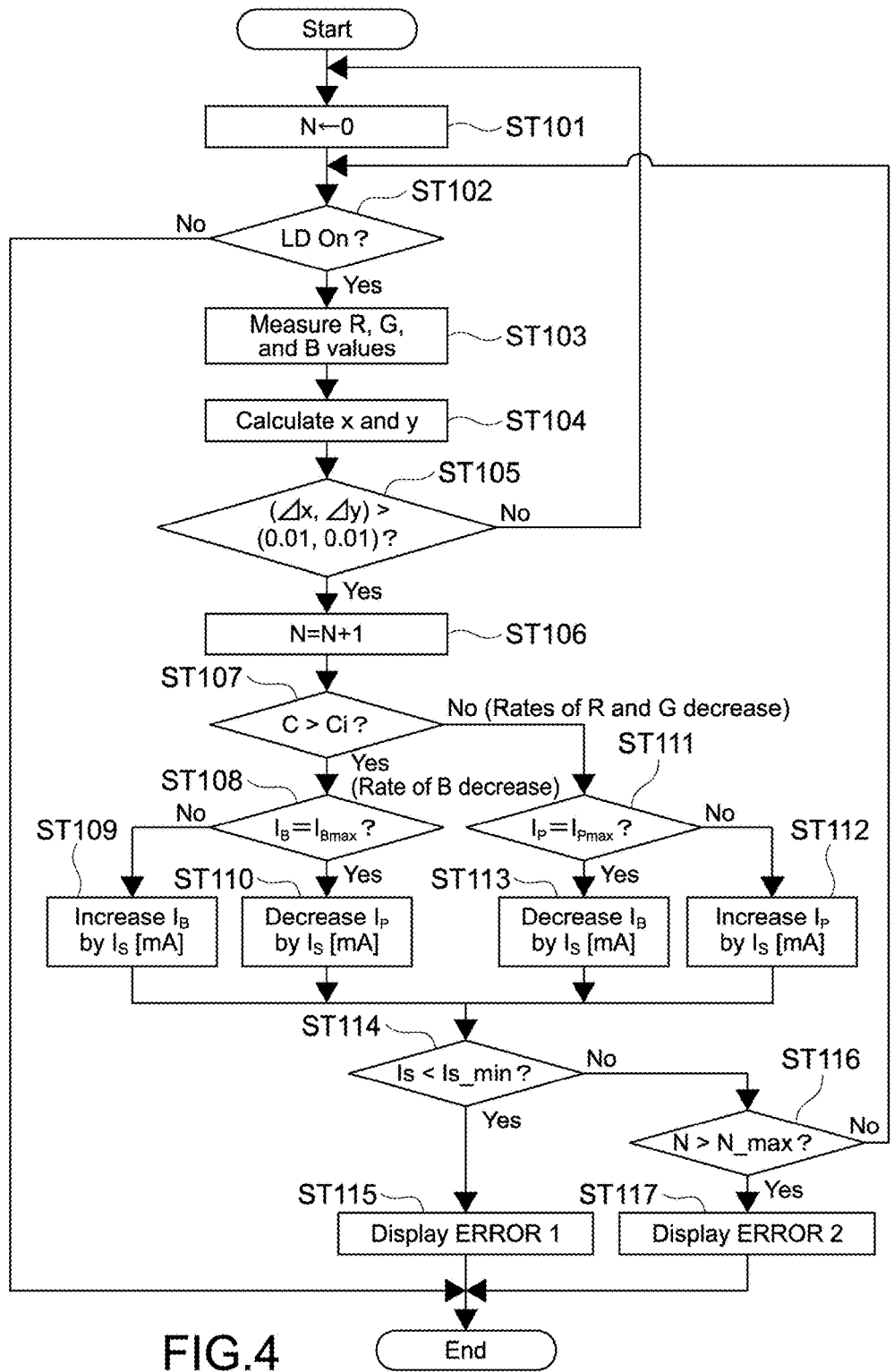
FIG. 4 is a flowchart showing, as an operation example of the light source apparatus, correction of chromaticity mainly.

FIG. 4 is a flowchart mainly showing correction of the chromaticity as an example of the operation of the light source apparatus 100. The process shown in FIG. 4 is attained by causing the blocks shown in FIG. 2 to operate in accordance with a predetermined control algorism. Hereinafter, the meanings of parameters shown in FIG. 4 will be explained.

R: sensor output value (red)
G: sensor output value (green)
B: sensor output value (blue)
C: ratio between (R+G) value and B value C=(R+G)/B
Ci: reference value of C (value set for each set)
IB: current value to first blue LD group (first drive current value) (unit: A)
IBmax: upper limit of first drive current value
IP: current value to second blue LD group (second drive current value) (unit: A)
IPmax: upper limit of second drive current value
IS: range of current changed in 1 sequence
Is: total of drive currents applied
Is_min: lower limit of drive current
N: number of correction loops
N_max: upper limit of number of correction loops As shown in FIG. 4, first, the number of correction loops N is set to 0 (Step 101). Then, it is determined whether the first and second blue LD groups 11 and 21 are on or not (Step 102). In the case where it is determined that the first and second blue LD groups 11 and 21 do not emit the laser light (No in Step 102), the correction of the chromaticity is terminated.

In the case where it is determined that the first and second blue LD groups 11 and 21 are turned on (Yes in Step 102), the sampling is performed by the sensor unit 511, and the intensity values of light of the RGB are measured (Step 103). The measurement values of the RGB are converted to values of the XYZ colorimetric system defined by CIE (Commission Internationale de l'Eclairage). Then, chromaticity coordinates (x, y) in the xy chromaticity diagram are calculated (Step 104).

Figure 5:
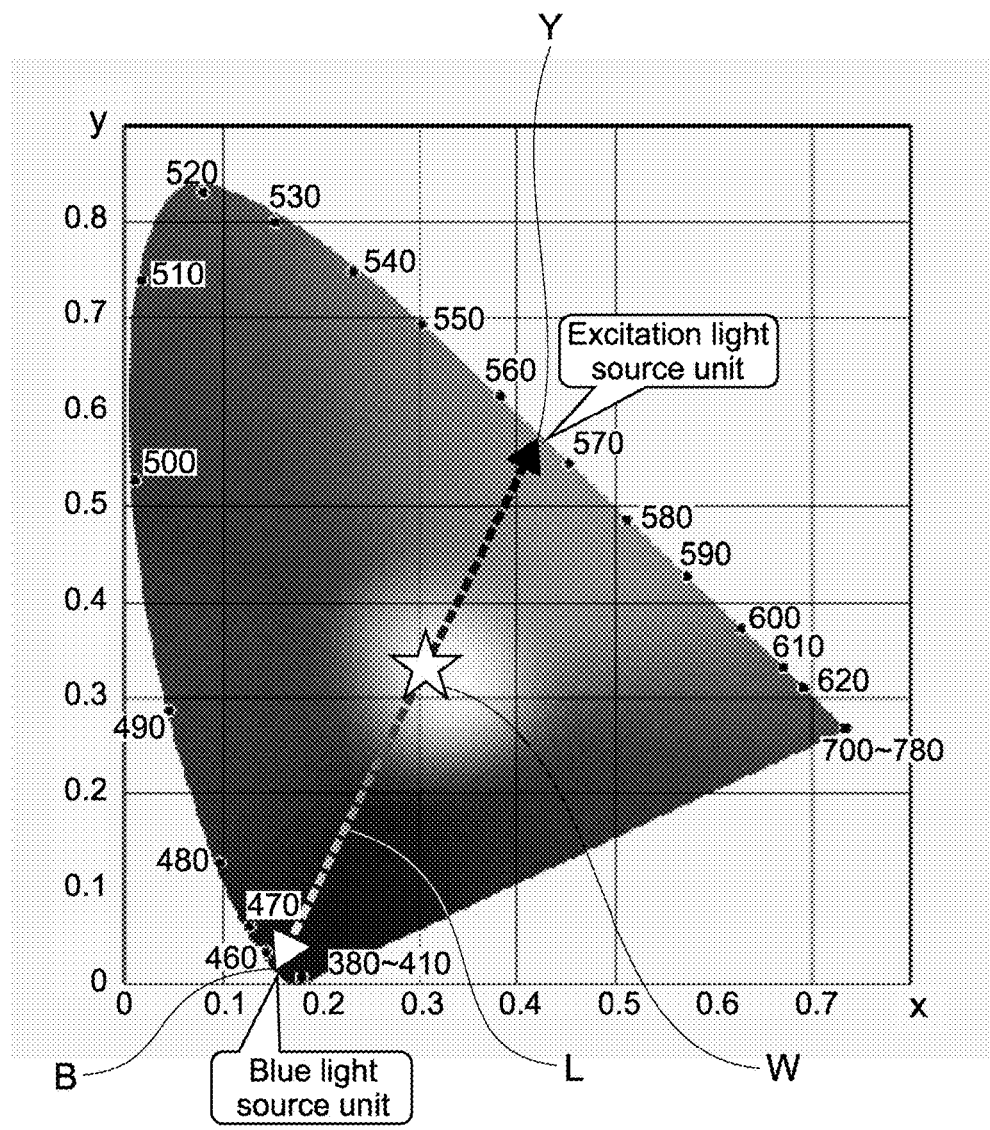
FIG. 5 is a diagram showing an xy chromaticity diagram of an XYZ colorimetric system.

FIG. 5 is a diagram showing an xy chromaticity diagram of the XYZ colorimetric system. Chromaticity coordinates of the blue laser light B output from the blue light source unit 10 are in the vicinity of a point B shown in FIG. 5. Chromaticity coordinates of the yellow light Y output from the excitation light source unit 20 is in the vicinity of a point Y shown in FIG. 5. Chromaticity coordinates of white light obtained by synthesizing the blue laser light B and the yellow light Y are in the vicinity of a straight line L formed by linking the points B and Y and are varied depending on the intensities of the blue laser light B and the yellow light Y. Therefore, on the straight line L, a white balance is controlled.

In this embodiment, the sensor unit 511 measures the chromaticity of the white light W. Depending on the change thereof, the drive currents to the first and second blue LD groups 11 and 21 are adjusted. For the chromaticity change, for example, with the chromaticity of the white light at a time of factory shipment as a reference, a deviation ($\Delta x$, $\Delta y$) from a reference value indicated by the star W shown in FIG. 5 is detected on the basis of a change with time, an artificial luminance adjustment, or the like. In the case where the deviation ($\Delta x$, $\Delta y$) of the chromaticity does not fall within a predetermined range, the drive current values to be applied to the first and second blue LD groups 11 and 21 are adjusted.

Figure 6:
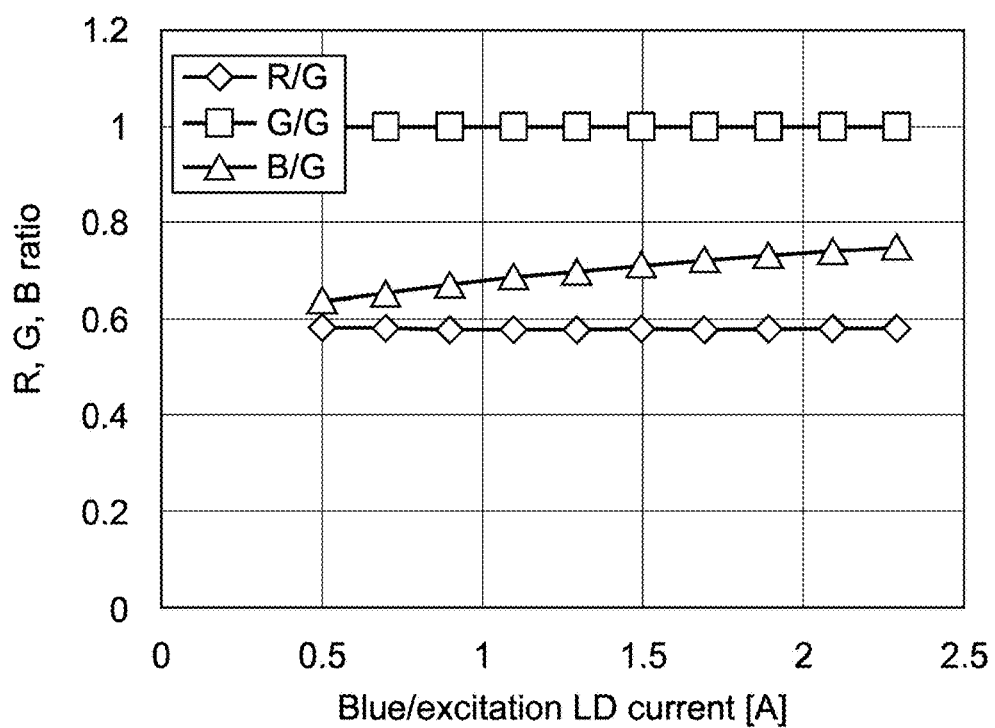
FIG. 6 is a graph showing a relationship between a ratio of drive currents applied to first and second blue LD groups and a ratio of an RGB value to be measured.

FIG. 6 is a graph showing a relationship between a ratio of the drive currents applied to the first and second blue LD groups 11 and 21 and a ratio of the RGB values measured. As shown in FIG. 6, with respect to the excitation LD current (second drive current), the blue LD current (first drive current) is relatively changed, with the result that a value of a ratio B/G is changed depending on the change. On the other hand, a ratio R/G value and a ratio G/G value are not changed.

Therefore, as can be seen from the graph, in the case where a rate of the blue laser light B in the white light W is intended to be increased, the first drive current value is increased, or the second drive current value is decreased. On the other hand, in the case where the yellow light Y in the white light W, that is, rates of red wavelength light R and green wavelength light G are intended to be increased, the first drive current value is decreased, or the second drive current value is increased.

It should be noted that the adjustment of the drive current may be made depending on whether the ratio of the intensities of the blue laser light B and the yellow light Y as the emitted light from the light sources falls within a predetermined range or not. Further, the adjustment of the drive current may be made depending on whether the ratio of the intensities of the red wavelength range light R, the green wavelength range light G, and the blue wavelength range light B falls within a predetermined range or not.

In this embodiment, a relationship $(\Delta x, \Delta y) < (0.01, 0.01)$ is set as a condition. Therefore, in Step 105 of FIG. 4, it is determined whether a relationship $(\Delta x, \Delta y) > (0.01, 0.01)$ is satisfied or not. In the case where the condition is satisfied (No in Step 105), that is, in the case where the xy chromaticities of the white light W are not deviated by 0.01 or more, respectively, the process returns to Step 101 without performing the correction.

In the case where the condition is not satisfied (Yes in Step 105), that is, in the case where the xy chromaticities of the white light W are deviated by 0.01 or more, respectively, in Step 106 and subsequent steps thereof, the drive currents to the first and second blue LD groups 11 and 21 are adjusted in such a manner that the deviation becomes within 0.01. As a result, the output powers of the light source units are appropriately controlled. It should be noted that a value of the degree of the deviation as a determination reference is not limited and may be set as appropriate.

To the number of correction loops N, 1 is added (Step 106). Then, it is determined whether C=(R+G)/B, as the ratio of the (R+G) value and the B value, is larger than the reference value Ci or not (Step 107). The reference value Ci is a value set when necessary on the basis of the characteristics of the image display apparatus 500 used or the like. For example, the reference value Ci is adjusted to a predetermined value at a time of factory shipment or an initial operation of the image display apparatus 500.

In the case where the ratio C is larger than the reference value Ci (Yes in Step 107), the rate of the measured blue laser light B is decreased. In view of this, it is determined whether the first drive current value IB is equal to IBmax as the upper limit of the first drive current value (Step 108). In the case of No in Step 108, the first drive current value IB is increased by a current range IS (unit: mA) changed in one sequence (Step 109). The current range IS may be set arbitrarily, and the unit is not limited to mA.

In the case of Yes in Step 108, it is difficult to increase the first drive current value IB, so the second drive current value IP is decreased by the current range IS (Step 110). As a result, it is possible to relatively increase the rate of the blue laser light B.

In Step 107, in the case where it is determined that the ratio C is smaller than the reference value Ci (No in Step 107), the rates of the red wavelength range light R and the green wavelength range light G measured are decreased. In view of this, it is determined whether the second drive current value IP is equal to IPmax as the upper limit of the second drive current value or not (Step 111). In the case of No in Step 111, the second drive current value IP is increased by the current range IS (unit: mA) (Step 112).

In the case of Yes in Step 111, it is difficult to increase the second drive current value IP, so the first drive current value IB is decreased by the current range IS (Step 113). As a result, the rates of the red wavelength range light R and the green wavelength range light G can be increased.

Subsequently, it is determined whether the total Is of the applied drive currents is smaller than the lower limit Is_min of the drive currents (Step 114). In the case where the total Is of the drive currents is smaller than the lower limit Is_min (Yes in Step 114), the luminance of an image to be generated is insufficient. Therefore, even if the chromaticity of the white light W falls within an appropriate range, an appropriate image displaying is difficult to be performed. Thus, in this case, on a screen, an operation display of the image display apparatus 500, or the like, ERROR 1, which indicates that an image is dark due to an insufficient luminance is displayed (Step 115). A display form thereof is not limited.

In the case of No in Step 114, it is determined whether the number of correction loops N is larger than the upper limit N_max of the number of correction loops (Step 116). In the case where the number of correction loops N is larger than the upper limit N_max (Yes in Step 116), ERROR 2, which indicates that an appropriate correction is difficult to be performed, is displayed (Step 117). A display form thereof is not limited. In the case of No in Step 116, the process returns to Step 102.

As described above, on the basis of the sampling result, by applying the first and second drive currents, whether the chromaticity of the white light W and the ratio of the intensities of the emitted light can be maintained within the predetermined ranges or not may be monitored. This process is performed by causing the correction unit shown in FIG. 1 to function as a monitoring unit, for example. Alternatively, a block that functions as the monitoring unit may be individually provided. It should be noted that an algorism for the monitoring is not also limited.

In FIG. 4, in order to set the white light W to have the desired chromaticity, the first and second drive currents are adjusted. In addition, by using the present technology, it is also possible to cause the white light W to have a desired luminance. That is, by correcting the first and second drive currents, it is possible to cause the white light W to have the desired luminance and easily adjust the luminance while maintaining the chromaticity, for example.

For example, to the correction unit 62 shown in FIG. 2, information relating to the luminance is input externally. Such external information includes information of an image generated by the illumination optical system and panel 506 that functions as the image generation system, information input from the user interface 504, and the like. Further, information relating to brightness, temperature, or the like of an environment in which the image display apparatus 500 is disposed.

It should be noted that, the external information in this case refers to information input from an outside part of the part structured as the light source apparatus 100. Therefore, the external information includes both of information input from an outside of the image display apparatus 500 and information input from a predetermined block in the image display apparatus 500 to the light source apparatus 100.

For example, for an image to be projected, a luminance histogram is detected in unit of 1 V (vertical scanning). From this detection result, for example, when a contrast of the image is insufficient or too strong, at least one of the first and second drive currents is controlled as necessary. As a result, it is possible to control the contrast of the image with high accuracy, thereby attaining high-quality image display.

Figure 7:
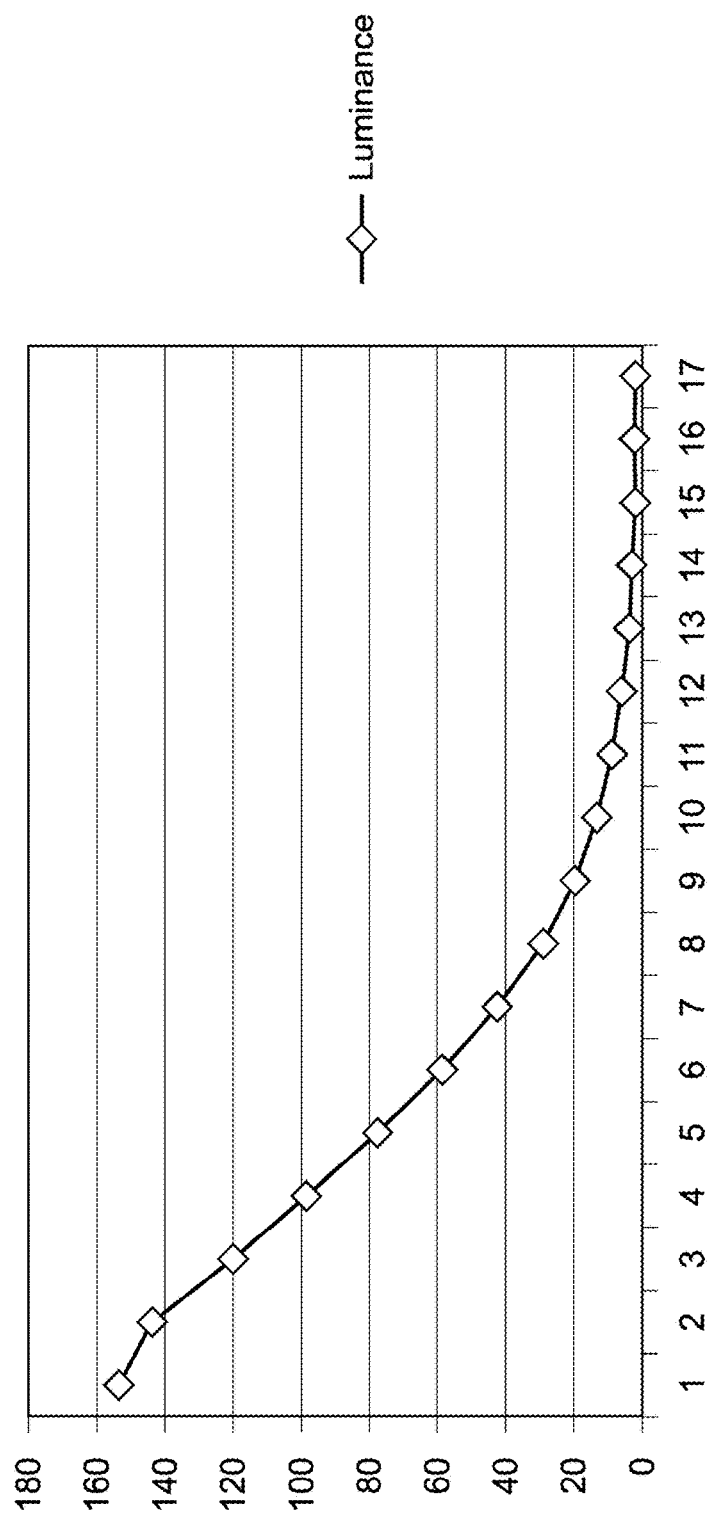
FIG. 7 is a diagram showing an example of table information used for a luminance adjustment.

FIG. 7 is a diagram showing an example of table information used to adjust the luminance. By the detection of the luminance histogram, a luminance as a target is set. In a storage unit or the like of the image display apparatus 500, a table having a luminance curve as exemplified in FIG. 7 is stored. The vertical axis of the graph indicates the luminances (unit: relative value set as appropriate), and the horizontal axis indicates parameter values for the control.

For example, a mechanical diaphragm mechanism is provided for a predetermined optical system, and a relationship between a size of the diaphragm and the luminance is stored as a table. Then, in such a manner that the same control as the luminance curve on the table can be performed, a control parameter value and a drive current value (for example, total of first and second drive current values, ratio thereof, or the like) are associated with each other. The correction unit 62 quickly obtains a drive current value for attaining the luminance target value from a control parameter value on the horizontal axis of the table and drives the first and second drive power supplies 41 and 42 on the basis of the current value. As a result, it is possible to control the luminance of the projected image.

As described above, it is also possible to perform the correction of the chromaticity shown in FIG. 4 while improving a contrast image quality by performing the luminance control by using the histogram. As a result, it is possible to emit the white light W having the desired chromaticity and luminance. That is, the adjustment of the luminance and the maintenance and management of the chromaticity can be performed at the same time, so it is possible to increase the image quality. Of course, to perform only one of the chromaticity control and the luminance control, the first and second drive current values may be controlled. Further, for the luminance control, the sampling result by the sensor unit 511 may be used.

FIG. 8 is a diagram showing an example of timing at which the luminance control and the chromaticity control are performed. For example, the luminance control is performed every 1 V (1/60 s (approximately 16.7 ms)). On the other hand, the chromaticity control using the sampling result is performed asynchronously therewith every about 1 s. For example, such control can be performed. Those periods are not limited. The luminance control may be performed for each frame rate or field rate of an image, or the luminance control and the chromaticity control may be performed synchronously with each other.

FIG. 9 is a diagram for explaining an example of the histogram detection. In order to achieve highly accurate histogram detection, out of all pixels, non-target pixels, which are pixels not to be subjected to the histogram detection, may be set. The non-target pixels are pixels that may hinder proper histogram detection, typically, pixels that expresses captions superimposed on images.

In the example shown in the upper side of FIG. 9, on a lower center of the image, a caption 45 of "ABCDE" is superimposed. The pixels that express the caption 45 are set as non-target pixels 46. As the setting method, for example, as shown in the lower side of FIG. 9, a rise angle and an amount of change of a luminance change between adjacent pixels are used. In the case where the rise angle and the amount of change exceed certain values, the pixels are determined to be the caption 45 and set as the non-target pixels 46. The setting method of the non-target pixels 46 is not limited, and any method may be used.

As described above, by setting the non-target pixels 46 as appropriate, it is possible to evaluate an accurate screen luminance and evaluate a contrast ratio of the screen correctly. As a result, the highly accurate luminance adjustment can be made, and the high-quality image display can be achieved.

Next, control for a sampling interval will be described. As described above, in the present technology, on the basis of the output characteristics of the blue light source unit 10 and the excitation light source unit 20, the common sampling interval is controlled. Specifically, in this embodiment, the excitation drive current value (second drive current value) to be applied to the second blue LD group 21 of the excitation light source unit 20 is set as a reference, and the common sampling interval is controlled. Hereinafter, this point will be described in detail.

FIG. 10A is a graph showing a relationship between the output power of the blue laser light as the excitation light E before being incident on the phosphor wheel and the drive current value, and a relationship between the output power of the yellow light Y emitted from the phosphor before being incident on the illumination optical system and the drive current value. FIG. 10B is a graph in which results shown in FIG. 10A are normalized at the output power in the case where the drive current value is 1.0 A.

When a continuous drive current (CW drive current) is applied while changing a current value, the output power of the blue laser light is approximately linearly changed with the change of the drive current value. That is, when the drive current value is increased, the output power of the blue laser light is approximately proportional thereto and increased. On the other hand, the output power of the yellow light Y has a non-linear light emitting characteristic as compared to the blue laser light. This is because the light intensity of the fluorescence emitted from the phosphor is decreased in the vicinity of a maximum output due to influence of luminance saturation or the like. As shown in FIGS. 10A and 10B, as the drive current value is increased, the increase rate of the output power of the yellow light Y becomes small.

Figure 11:
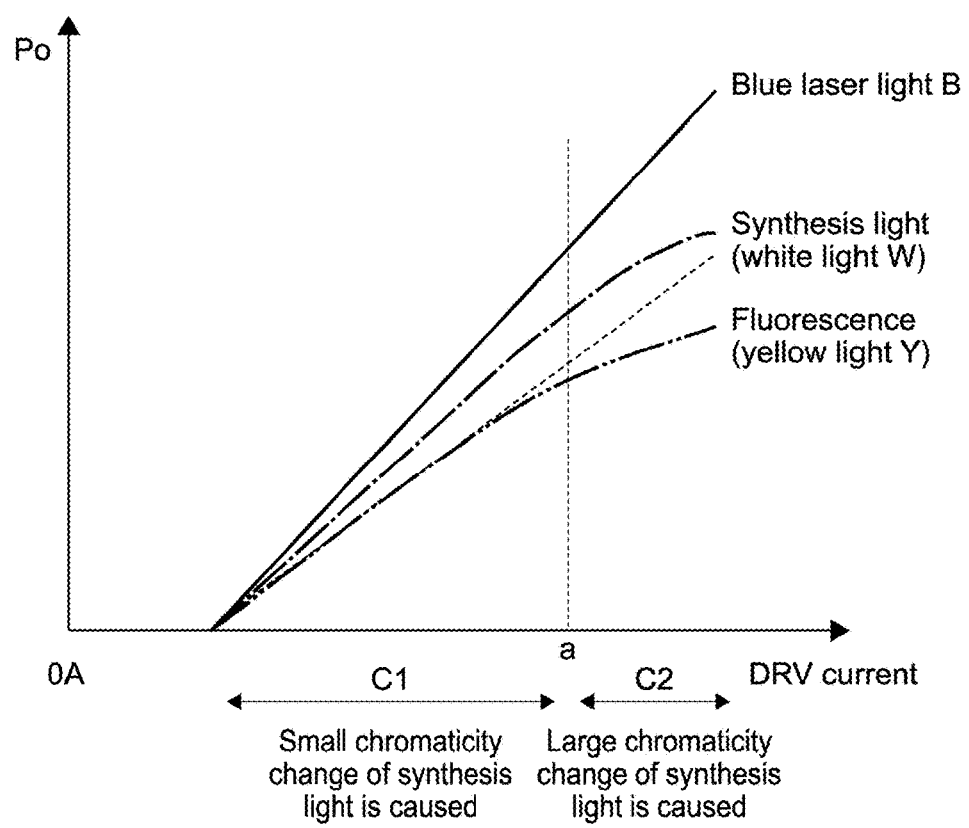
FIG. 11 is a graph showing output powers of blue laser light, yellow light and white light with respect to drive current values.

FIG. 11 is a graph showing the output power of each light with respect to the drive current value. The output power of the blue laser light B emitted from the first blue LD group 11, the output power of the yellow light Y as the fluorescence, and the output power of the white light W as the synthesis light are shown.

As shown in FIG. 11, the output power of the blue laser light B changes linearly with respect to the change of the drive current value. On the other hand, the output power of the yellow light Y changes non-linearly. As a result, the output power of the white light W also changes non-linearly with respect to the change of the drive current value. In a range C1, which is smaller than a predetermined current value a (A) shown in FIG. 11, the output power of the white light W changes linearly with respect to the change of the drive current value. Therefore, in the range C1, the chromaticity change of the white light W is small.

On the other hand, in a range C2, which is larger than a predetermined current value a, the increase rate of the output power of the white light W becomes smaller. In the range C2, due to the decrease of the output power of the yellow light Y, the chromaticity change of the white light W is increased. Because the light emission characteristic of the yellow light Y that changes non-linearly is grasped in advance, on the basis of the drive current value at the time of the change of the luminance or the like, the sampling by the sensor unit 511 is performed slowly in the range C1 in which the linear change occurs and is performed frequently in the range C2 in which the non-linear change occurs. As a result, it is possible to achieve the highly accurate chromaticity control and save the power consumption.

Figure 12:
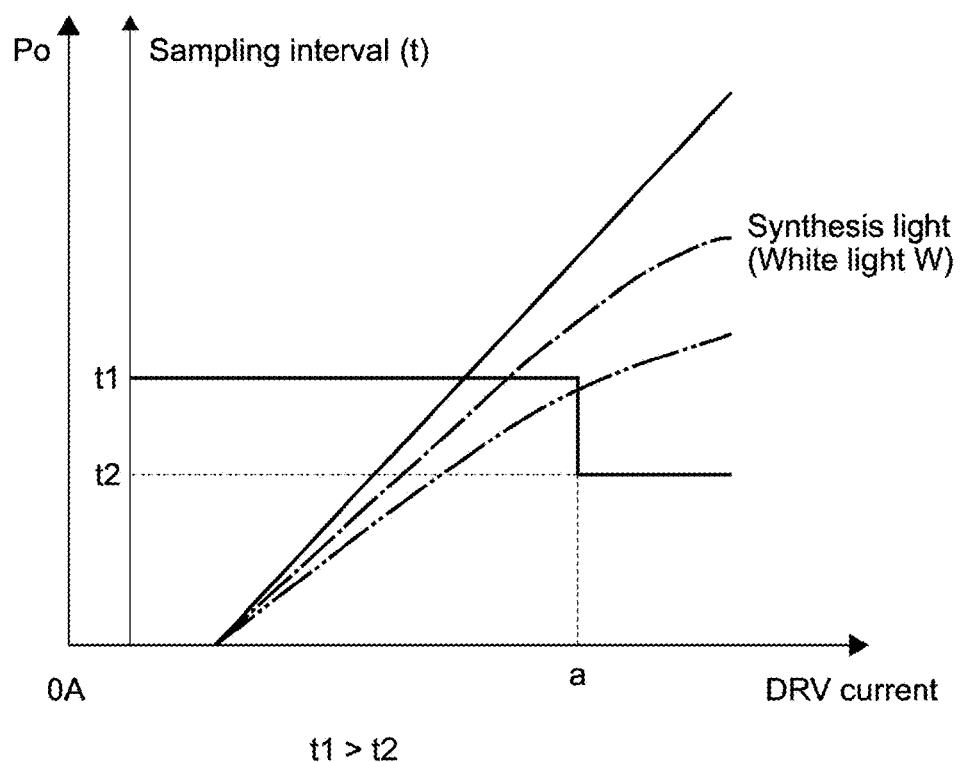
FIG. 12 is a graph showing an example of control for common sampling intervals corresponding to output characteristics.

FIG. 12 is a graph showing an example of the control for the common sampling interval in accordance with the output characteristic. As shown in FIG. 12, the predetermined current value a is set as a threshold value a. In the case where the second drive current value applied to the second blue LD group 21 is smaller than the threshold value a, a first common sampling interval t1 is set. In addition, in the case where the second drive current value is larger than the threshold value a, a second common sampling interval t2, which is smaller than the first common sampling interval t1, is set.

The specific degrees of the first and second common sampling intervals t1 and t2 are not limited. For example, a frame rate of an image to be generated may be used as a reference. That is, the first common sampling interval t1 is set to be larger than the frame rate, and the second common sampling interval t2 is set to be smaller than the frame rate. For example, by the setting, the highly accurate chromaticity control is achieved. It should be noted that, instead of the frame rate, a vertical scanning period (that may be equal to the frame rate in some cases) is used as a reference, and the first and second common sampling intervals t1 and t2 may be set.

Figure 13:
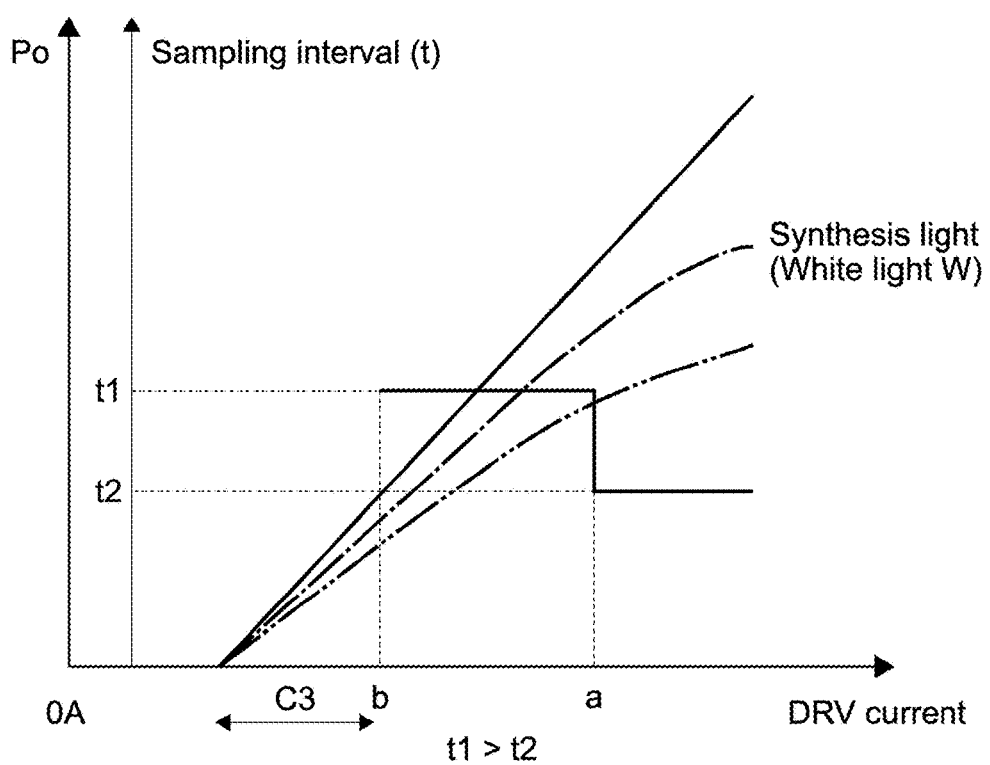
FIG. 13 is a graph showing another example of control for common sampling intervals.

FIG. 13 is a graph showing another example of the control for the common sampling interval. For example, for the drive current value, a second threshold value b may be set to be smaller than the threshold value a. In a range C3 from the start of the application of the drive current to the second threshold value b, the sampling may not be performed. This is based on a thought that the chromaticity change of the white light W is sufficiently small in the range in which the drive current value is small. As described above, the range C3 in which the sampling is not performed may be set. As a result, it is possible to reduce a process load and save the power consumption.

As described above, in the light source apparatus 100 according to this embodiment, the intensities of the blue laser light B and the yellow light Y emitted from the blue light source unit 10 and the excitation light source unit 20, respectively, are sampled at the predetermined sampling interval. At this time, on the basis of the output characteristics of the light source units, the predetermined sampling interval is controlled. As a result, it is possible to control the chromaticity and luminance of the white light W emitted from the light source apparatus 100 with high accuracy.

In addition, by using the present technology, in a projector or the like having a plurality of solid light sources with different light emission characteristics and a photo sensor that detects a light emission intensity, when a photo sensor value is used to perform feedback control for light source modulation to hold the chromaticity, thereby arbitrarily changing the brightness, light detection timing of the sensor is changed as necessary in accordance with the light emission characteristics of the light sources. Therefore, it is possible to save the power consumption.

In addition, because a chromaticity deviation due to deterioration with time of the solid light sources can be automatically corrected, it is possible to increase reliability and image quality. Further, the light output intensities of some solid light sources do not show the linear change with respect to the input power for the light emission. Even in the case where the chromaticity of the synthesis light is not constant, it is possible to automatically correct the chromaticity of the synthesis light with high accuracy, with the result that a limitation does not have to be set for the output characteristics of the light sources, and the degree of freedom of light source design is increased. As a result, this is advantageous to downsize the apparatus.

Further, while maintaining the chromaticity, the luminance adjustment can be made by the light source modulation (control for the drive current). Thus, it is possible to achieve a luminance adjustment by a user, a luminance adjustment by environmental light, and an auto iris of the image display apparatus without a mechanical diaphragm. In particular, in the case where an eccentric optical system is used as in this embodiment, an aspheric lens or an aspheric mirror is often provided. An optical axis is deviated, or an asymmetric light flux is caused, so it is difficult to design a mechanical diaphragm mechanism. In addition, forming such an asymmetric diaphragm mechanism increases in cost.

In the present technology, the problem as described above can be overcome, and the eccentric optical system and a special optical system such as a short focus are adopted. Therefore, for a projector or the like for which a mechanical diaphragm mechanism is difficult to be provided, it is possible to easily attain a luminance adjustment function equal to the diaphragm mechanism. The mechanical diaphragm mechanism is unnecessary because the auto iris is used, which is advantageous in terms of the cost and power consumption. Further, the mechanical diaphragm mechanism tends to show a slow reaction rate. The present technology has an advantage also in this point. Further, the iris is electrically performed, so it is also possible to arbitrarily set a luminance adjustment speed by an image.

<Other Embodiments>

The present technology is not limited to the above embodiment, and various other embodiments can be achieved.

Figure 14A:
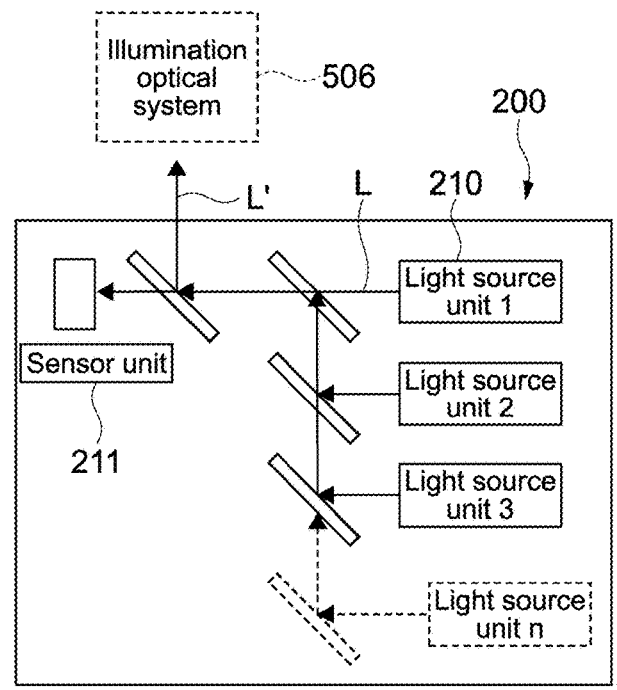
FIGS. 14A and 14B are schematic diagrams showing other examples of the structure of the light source apparatus.
Figure 14B:
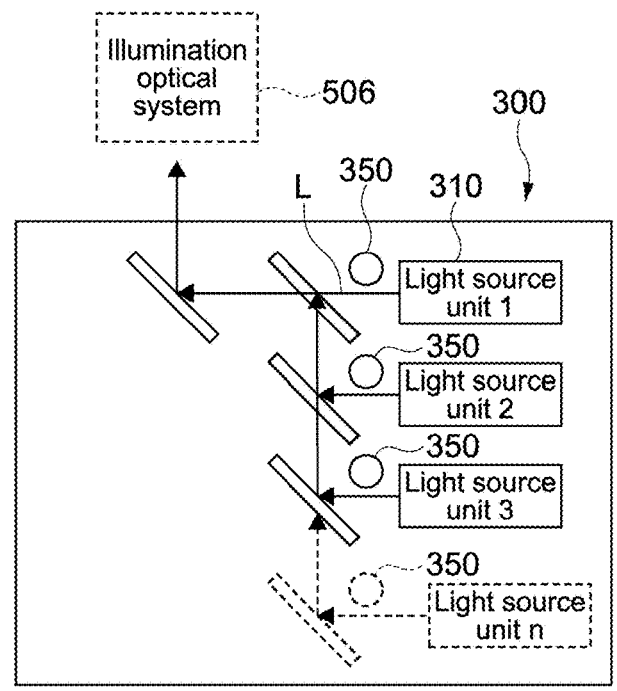

FIGS. 14A and 14B are schematic diagrams showing examples of the structure of a light source apparatus 200 according to the present technology. In the above description, in the light source apparatus shown in FIG. 2, as the plurality of light source units, the two light source units of the blue light source unit 10 and the excitation light source unit 20 are used. However, the number of light source units provided as the plurality of light source units is not limited.

For example, as shown in FIG. 14A, arbitrary n light source units 210 are used. Emitted light L from the light source units 210 is synthesized, and with synthesis light L', the illumination optical system 506 may be irradiated. A sensor unit 211 may sample intensities of each emitted light L. On the basis of output characteristics of the light source units 210, the sampling interval (for example, common sampling interval) is controlled as necessary, with the result that it is possible to perform chromaticity control and luminance control with high accuracy.

As in the case of a light source apparatus 300 shown in FIG. 14B, for each light source unit 310, a sensor 350 may be provided. An intensity of the emitted light L from each of the light source units 310 may be measured by the sensors 350 provided for each light source unit 310. In this case, to the light source apparatus 300, the plurality of sensors 350, the number of which is the same as that of the plurality of the light source units 310, are provided.

The light intensities measured by the sensors 350 are sampled by a sampling unit (not shown). At this time, not the common sampling interval but a predetermined sampling interval may be individually set for each of the light source units 310 (for each emitted light L). The individually set sampling intervals may be controlled in accordance with the output characteristics of the plurality of light source units 310. As a result, it is possible to perform the chromaticity control and the luminance control with high accuracy.

For example, in the light source apparatus 100 shown in FIG. 2, a first sensor that receives the blue laser light B and measures an intensity thereof and a second sensor that receives the yellow light Y and measures intensities of red wavelength range light and green wavelength range light may be used.

It should be noted that, as in the above embodiment, the single sensor capable of measuring the intensities of the emitted light is used with respect to the plurality of light source units, thereby making it possible to reduce the cost of the components and achieve simplification and downsizing of the structure of the apparatus. Further, by setting the common sampling interval, it is possible to sample the intensities of the emitted light with the simple structure, which is advantageous to downsize the light source apparatus.

In the above, to make the explanation simple, in the image display apparatus, the block that functions as the light source apparatus is described. This does not mean that only the structure where the light source apparatus according to the present technology is independently provided in the image display apparatus is adopted. That is, the application of the present technology is not limited to the case where the light source apparatus is independently structured. For example, a part or a whole of the blocks that exert the various functions in the image display apparatus may attain the structure and the operation described as the light source apparatus according to the present technology. On the other hand, the light source apparatus according to the present technology may be used alone. In this case, a control unit that controls mechanisms of the light source apparatus executes a predetermined program. Further, a storage unit of the light source apparatus stores various programs and table information therein.

It should be noted that the effects described in the present disclosure are merely examples, and there is no limitation thereon. Other effects may be provided. The description on the plurality of effects does not necessarily mean that those effects are exerted at the same time. Depending on a condition or the like, at least any one of the effects is obtained, and effects that are not described in the present disclosure may of course be exerted.

At least two of the characteristic parts of the embodiments described above can be combined. That is, the various characteristic parts described in the embodiments may be arbitrarily combined without discrimination of the embodiments.

It should be noted that the present disclosure can take the following configurations.

(1) A light source apparatus, including:
a plurality of light source units;
a sensor unit capable of receiving a plurality of emitted light beams from the plurality of light source units and sampling intensities of the emitted light beams at a predetermined sampling interval; and
an interval control unit capable of controlling the predetermined sampling interval on the basis of an output characteristic relating to each of the emitted light beams from the plurality of light source units.

(2) The light source apparatus according to Item (1), further including
a drive unit capable of applying a drive current to each of the plurality of light source units, in which
the interval control unit controls the predetermined sampling interval on the basis of the output characteristic for the drive current from the drive unit.

(3) The light source apparatus according to Item (2), in which
the interval control unit controls the predetermined sampling interval with a value of the drive current applied to each of the plurality of light source units as a reference.

(4) The light source apparatus according to Item (2) or (3), in which
on the basis of a result of the sampling, the drive unit applies the drive current to each of the plurality of light source units in such a manner that a ratio of the intensities of the emitted light beams falls within a predetermined range.

(5) The light source apparatus according to any one of Items (2) to (4), in which
the drive unit is capable of adjusting the value of the drive current applied to each of the plurality of light source units on the basis of information from outside.

(6) The light source apparatus according to any one of Items (1) to (5), in which
the sensor unit receives synthesis light obtained by synthesizing the plurality of emitted light beams and samples intensities of the emitted light beams at a common sampling interval, and
the interval control unit controls the common sampling interval.

(7) The light source apparatus according to Item (6), in which
the plurality of light source units includes
a first light source unit having a first solid light source group including one or more solid light sources that emit a first visible light with a predetermined wavelength range, and
a second light source unit having a second solid light source group including one or more solid light sources that emit excitation light with a predetermined wavelength range and a light emitting body that emits a second visible light with a wavelength range different from the excitation light with the predetermined wavelength range by being excited by the excitation light,
the light source apparatus further including
a synthesis unit configured to generate white light obtained by synthesizing the first visible light that is the emitted light from the first light source unit and the second visible light that is the emitted light from the second light source unit.

(8) The light source apparatus according to Item (7), in which
the first and second solid light source groups each are capable of emitting light with a blue wavelength range, and
the light emitting body emits light including light with a red wavelength range and light with a green wavelength range.

(9) The light source apparatus according to Item (7) or (8), in which
in the case where a value of an excitation drive current applied to the second solid light source group is smaller than a predetermined threshold value, the interval control unit sets a first common sampling interval, and in the case where the value of the excitation drive current is larger than the predetermined threshold value, the interval control unit sets a second common sampling interval smaller than the first common sampling interval.

(10) The light source apparatus according to Item (8) or (9), in which the sensor unit includes a single sensor capable of measuring intensities of light with the blue wavelength range, light with the red wavelength range, and light with the green wavelength range.

(11) The light source apparatus according to any one of Items (4) to (10), further including a monitoring unit configured to monitor whether the ratio of the intensities of the emitted light beams is capable of being maintained within the predetermined range by applying the drive current based on the result of the sampling.

(12) An image display apparatus, including:

(a) a light source apparatus including a plurality of light source units, a sensor unit capable of receiving a plurality of emitted light beams from the plurality of light source units and sampling intensities of the emitted light beams at a predetermined sampling interval, an interval control unit capable of controlling the predetermined sampling interval on the basis of an output characteristic relating to each of the emitted light beams from the plurality of light source units, and a synthesis unit configured to generate synthesis light by synthesizing the emitted light beams from the plurality of light source units;

(b) an image generation system including an image generation element that generates an image on the basis of irradiation light, and an illumination optical system that irradiates the image generation element with the synthesis light emitted from the light source apparatus; and (c) a projection system configured to project the image generated by the image generation element.

(13) The image display apparatus according to Item (12), in which the light source apparatus includes a drive unit capable of applying a drive current to each of the plurality of light source units, and the interval control unit controls the predetermined sampling interval on the basis of the output characteristic for the drive current from the drive unit.

(14) The image display apparatus according to Item (13), in which the interval control unit sets a threshold value to a value of the drive current from the drive unit, sets a first sampling interval in the case where the value of the drive current is smaller than the threshold value, and sets a second sampling interval smaller than the first sampling interval in the case where the value of the drive current is larger than the threshold value.

(15) The image display apparatus according to Item (14), in which, the first sampling interval is larger than a frame rate of the image generated by the image generation system, and the second sampling interval is smaller than the frame rate of the image generated.

(16) The image display apparatus according to any one of Items (13) to (15), in which on the basis of information relating to the image generated by the image generation system, the drive unit adjusts the value of the drive current applied to each of the plurality of light source units.

(17) The image display apparatus according to any one of Items (12) to (16), in which the projection system projects the image by an eccentric optical system.

(18) An image display apparatus, including:

a plurality of light source units, a sensor unit capable of receiving a plurality of emitted light beams from the plurality of light source units and sampling intensities of the emitted light beams at a predetermined sampling interval, an interval control unit capable of controlling the predetermined sampling interval on the basis of an output characteristic relating to each of the emitted light beams from the plurality of light source units, a synthesis unit configured to generate synthesis light by synthesizing the emitted light beams from the plurality of light source units, an image generation system including an image generation element that generates an image on the basis of irradiation light and an illumination optical system that irradiates the image generation element with the synthesis light generated by the synthesis unit, and a projection system configured to project the image generated by the image generation element.

It should be understood by those skilled in the art that various modifications, combinations, sub-combinations and alterations may occur depending on design requirements and other factors insofar as they are within the scope of the appended claims or the equivalents thereof.

What is claimed is:

1. A light source apparatus, comprising:
a plurality of light source units;
a sensor unit configured to receive a plurality of emitted light beams from the plurality of light source units and to sample intensities of the emitted light beams at a sampling interval; and
an interval control unit configured to control the sampling interval at which the sensor unit is sampled on the basis of an output characteristic relating to each of the emitted light beams from the plurality of light source units.

2. The light source apparatus according to claim 1, further comprising
a drive unit configured to apply a drive current to each of the plurality of light source units, wherein
the interval control unit controls the sampling interval on the basis of the output characteristic for the drive current from the drive unit.

3. The light source apparatus according to claim 2, wherein
the interval control unit controls the sampling interval with a value of the drive current applied to each of the plurality of light source units as a reference.

4. The light source apparatus according to claim 2, wherein
on the basis of a result of the sampling, the drive unit applies the drive current to each of the plurality of light source units in such a manner that a ratio of the intensities of the emitted light beams falls within a predetermined range.

5. The light source apparatus according to claim 2, wherein
the drive unit is configured to adjust the value of the drive current applied to each of the plurality of light source units on the basis of information from outside.

6. The light source apparatus according to claim 1, wherein
the sensor unit receives synthesis light obtained by synthesizing the plurality of emitted light beams and samples intensities of the emitted light beams at a common sampling interval, and
the interval control unit controls the common sampling interval.

7. The light source apparatus according to claim 6, wherein
the plurality of light source units includes
a first light source unit having a first solid light source group including one or more solid light sources that emit a first visible light with a predetermined wavelength range, and
a second light source unit having a second solid light source group including one or more solid light sources that emit excitation light with a predetermined wavelength range and a light emitting body that emits a second visible light with a wavelength range different from the excitation light with the predetermined wavelength range by being excited by the excitation light,
the light source apparatus further comprising
a synthesis unit configured to generate white light obtained by synthesizing the first visible light that is the emitted light from the first light source unit and the second visible light that is the emitted light from the second light source unit.

8. The light source apparatus according to claim 7, wherein
the first and second solid light source groups each are configured to emit light with a blue wavelength range, and
the light emitting body emits light including light with a red wavelength range and light with a green wavelength range.

9. The light source apparatus according to claim 7, wherein
in the case where a value of an excitation drive current applied to the second solid light source group is smaller than a predetermined threshold value, the interval control unit sets a first common sampling interval, and in the case where the value of the excitation drive current is larger than the predetermined threshold value, the interval control unit sets a second common sampling interval smaller than the first common sampling interval.

10. The light source apparatus according to claim 8, wherein
the sensor unit includes a single sensor configured to measure intensities of light with the blue wavelength range, light with the red wavelength range, and light with the green wavelength range.

11. The light source apparatus according to claim 4, further comprising
a monitoring unit configured to monitor whether the ratio of the intensities of the emitted light beams can be maintained within the predetermined range by applying the drive current based on the result of the sampling.

12. An image display apparatus, comprising:
(a) a light source apparatus including
a plurality of light source units,
a sensor unit configured to receive a plurality of emitted light beams from the plurality of light source units and to sample intensities of the emitted light beams at a sampling interval,
an interval control unit configured to control the sampling interval at which the sensor unit is sampled on the basis of an output characteristic relating to each of the emitted light beams from the plurality of light source units, and
a synthesis unit configured to generate synthesis light by synthesizing the emitted light beams from the plurality of light source units;
(b) an image generation system including
an image generation element that generates an image on the basis of irradiation light, and
an illumination optical system that irradiates the image generation element with the synthesis light emitted from the light source apparatus; and
(c) a projection system configured to project the image generated by the image generation element.

13. The image display apparatus according to claim 12, wherein
the light source apparatus includes a drive unit configured to apply a drive current to each of the plurality of light source units, and
the interval control unit controls the sampling interval on the basis of the output characteristic for the drive current from the drive unit.

14. The image display apparatus according to claim 13, wherein
the interval control unit sets a threshold value to a value of the drive current from the drive unit, sets a first sampling interval in the case where the value of the drive current is smaller than the threshold value, and sets a second sampling interval smaller than the first sampling interval in the case where the value of the drive current is larger than the threshold value.

15. The image display apparatus according to claim 14, wherein,
the first sampling interval is larger than a frame rate of the image generated by the image generation system, and the second sampling interval is smaller than the frame rate of the image generated.

16. The image display apparatus according to claim 13, wherein
on the basis of information relating to the image generated by the image generation system, the drive unit adjusts the value of the drive current applied to each of the plurality of light source units.

17. The image display apparatus according to claim 12, wherein
the projection system projects the image by an eccentric optical system.

* * * * *